United States Patent [19]

Bower

[11] 3,950,188

[45] Apr. 13, 1976

[54] METHOD OF PATTERNING POLYSILICON

[75] Inventor: Robert W. Bower, Santa Clara, Calif.

[73] Assignee: TRW Inc., Redondo Beach, Calif.

[22] Filed: May 12, 1975

[21] Appl. No.: 576,912

[52] U.S. Cl. ................. 148/1.5; 148/175; 148/187; 357/91
[51] Int. Cl.² ....................................... H01L 21/265
[58] Field of Search ........ 148/1.5, 175, 187; 357/91

[56] References Cited
UNITED STATES PATENTS

| | | | |
|---|---|---|---|
| 3,576,478 | 4/1971 | Watkins et al. | 148/175 X |
| 3,736,193 | 5/1973 | Tucker et al. | 148/175 |
| 3,756,861 | 9/1973 | Payne et al. | 148/1.5 |
| 3,793,088 | 2/1974 | Eckton et al. | 148/1.5 |
| 3,852,119 | 12/1974 | Gosney et al. | 148/1.5 |
| 3,865,652 | 2/1975 | Agusta et al. | 148/187 |
| 3,873,371 | 3/1975 | Wolf | 148/1.5 |

*Primary Examiner*—L. Dewayne Rutledge
*Assistant Examiner*—J. M. Davis
*Attorney, Agent, or Firm*—Daniel T. Anderson; Jerry A. Dinardo; Stephen J. Koundakjian

[57] ABSTRACT

A semiconductor substrate is coated with an insulating film followed by a layer of polysilicon. The polysilicon layer is coated with a non-oxidizable mask, such as silicon nitride, and then oxidized to convert the exposed regions to silicon oxide and add further thickness to the converted oxide regions. When the mask is removed, the thicker silicon oxide regions serve as an in situ mask for selectively implanting impurity ions through the thinner polysilicon regions and into the semiconductor substrate. When the silicon oxide regions are etched away, the remaining polysilicon regions serve as an ion implantation mask for permitting selective ion implantation through the voids left by etching the silicon oxide regions.

12 Claims, 7 Drawing Figures

METHOD OF PATTERNING POLYSILICON

BACKGROUND OF THE INVENTION

This invention relates to a method of fabricating microelectronic circuit elements and particularly to a method of forming electrically isolated regions of polycrystalline silicon on an insulating substrate.

Polycrystalline silicon, more commonly referred to as polysilicon, is used extensively in silicon integrated circuit technology as a first layer of isolated conductive elements, particularly in structures where a second conductive layer is to be formed. It is also advantageously used as a conductor in MOS structures and techniques known as "silicon gate."

In the usual processing of the foregoing structures, the polysilicon is deposited over the entire surface of a wafer and then it is selectively etched through a mask. The mask is usually a material such as silicon nitride or alumina which itself is formed by photolithographic masking and etching techniques into a pattern which is duplicated by the polysilicon. The etching step that forms the polysilicon pattern is referred to as silicon etch and employs an etchant that removes the polysilicon from the unwanted regions without attacking the silicon nitride or alumina, and thereby leaves polysilicon directly beneath the silicon nitride or alumina. Finally, the silicon nitride or alumina is removed by etching.

The foregoing silicon etch process has several disadvantages. One drawback is that the polysilicon is undesirably undercut beneath the silicon nitride or alumina. When a layer of material suffers undercutting, it is difficult to deposit and pattern thereover subsequent layers which do not have discontinuities at the undercut boundaries. Another drawback is that the polysilicon structure that remains after the silicon nitride or alumina is removed is higher or thicker than the etched region surrounding it. Such a structure does not readily faciliate the formation of selective ion implants beneath the polysilicon.

SUMMARY OF THE INVENTION

The fabrication process according to the invention comprises forming the silicon nitride or alumina pattern over the polysilicon layer in the conventional manner. However, instead of etching the polysilicon layer, the structure is subjected to an oxidation treatment whereby the exposed regions of the polysilicon layer are not only converted to silicon oxide throughout their entire depth but also the silicon oxide is built up to a greater thickness than the unexposed polysilicon. Consequently, when the silicon nitride or alumina layer is removed, the remaining polysilicon layer is surrounded by or embedded in a silicon oxide layer that is higher or thicker than the polysilicon.

The thicker silicon oxide layer may be advantageously used as a self-aligned mask for ion implantation in the regions beneath the polysilicon pattern. Subsequent removal of the silicon oxide leaves the polysilicon layer thicker thann its surrounding regions, which is the condition that prevails after conventional silicon etch.

The oxidation process accordingly provides an additional self aligned thick oxide pattern which may serve as a mask for ion implantation processing. The oxidation process also yields a tapered polysilicon structure rather than an undercut structure. These features may be advantageously employed in the silicon gate technology when multilayer continuous pattern structures are required and self aligned doping is often advantageous. As an example of the use of these features, a charge coupled device may be constructed which incorporates multilayer elements and self-aligned ion implanted regions to form the charge transfer and storage regions.

DESCRIPTION OF THE PREFERRED EMBODIMENT

Figure 1:
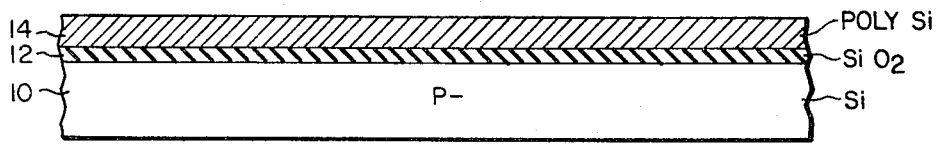
FIGS. 1 through 7 are sectional views showing various stages of constructing a charge coupled device according to the invention.

A charge coupled device (CCD) may be advantageously fabricated according to the method of the invention. As shown by way of example in FIG. 1, a wafer 10, which may be of p type silicon, is first provided with a silicon oxide coating 12 and then with a layer 14 of polysilicon. The silicon oxide coating 12 may be thermally grown on the wafer 10 by conventional means to a desired thickness which is a function of the temperature and time of exposure to an oxidizing atmsophere. The polysilicon layer 14 is formed by the pyrolysis of ammonia and silane or silicon tetrachloride in a nitrogen carrier gas at a temperature of about 800° C., as is well known.

Figure 2:
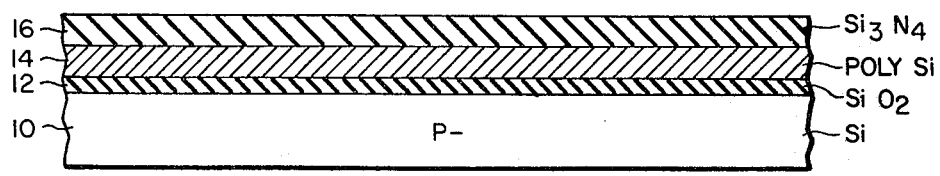

Referring now to FIG. 2, the next step comprises forming a layer 16 of silicon nitride or alumina on the polysilicon layer 14. The nature of the layer 16 is such that it will not readily oxidize, and also that it can be etched by an etchant that does not attack either the polysilicon layer 14 or the silicon oxide layer 12. Furthermore, the layer 16 must not interact with the other materials of the structure at temperatures in the neighborhood of 1000° C. Silicon nitride or alumina satisfy all the above requirements, although silicon nitride is preferred because of its better etchability.

Figure 3:
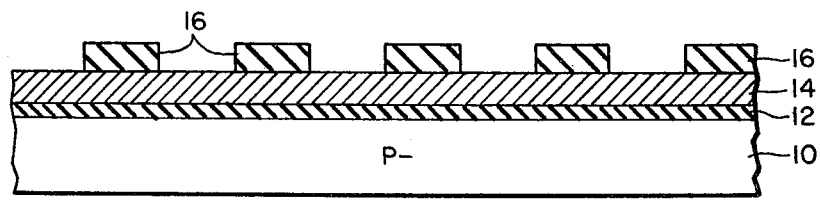
Figure 4:
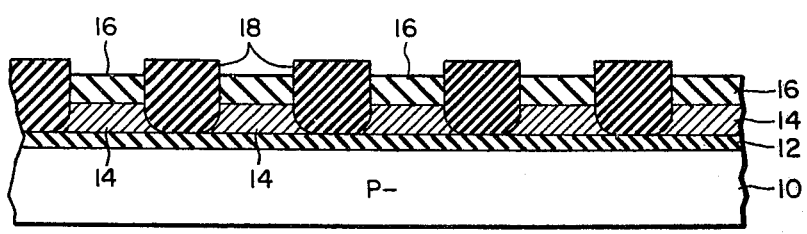

The next step in the processing is shown in FIG. 3 and comprises forming the silicon nitride layer 16 into a pattern of separate strip-like elements. The patterning may be done most conveniently be well known photolithographic techniques. The patterned layer 16 serves as a mask for the selective oxidation of the polysilicon layer 14 which is next performed by simply heating the fabricated structure in air at a temperature of about 1000° C. Such heat treatment is carried out until the exposed regions of the polysilicon layer 14 are converted to silicon oxide through the entire depth of the layer 14. During this same heat treatment the silicon oxide will grow in thickness in the exposed regions to a height exceeding that of the silicon nitride layer 16, as shown in FIG. 4. In this figure, the oxide elements formed by converting the exposed regions of the polysilicon layer 14 and by further thermal growth are shown as the thick strip elements 18.

Those portions of the polysilicon layer 14 that are converted to oxide and now constitute the lower portions of the thick oxide elements 18 are tapered in width towards the bottom. Conversely, the isolated regions of the polysilicon layer 14 adjacent the thick oxide elements 18 are tapered in width towards the top. As pointed out above, a tapered configuration for the polysilicon elements is a more desirable one than the undercut geometry that results from conventional selective acid etching thereof.

Figure 5:
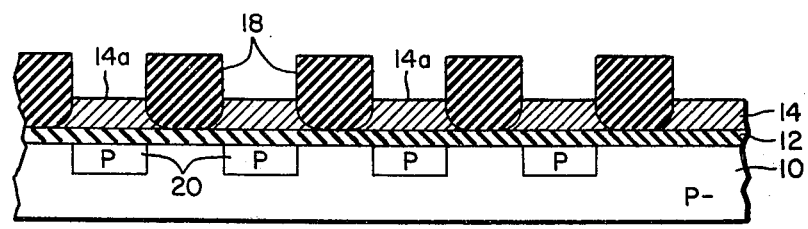

The silicon nitride mask or patterned layer 16 is removed by chemical etching, such as with hot phosphoric acid at about 180°C. The structure now remaining consists of isolated elements 14a of polysilicon layer 14 separated by insulation elements 18 of silicon oxide, as shown in FIG. 5. The polysilicon strip elements 14a will serve ultimately as a first group of electrodes in the finished structure. The oxide elements 18 are substantially thicker than the polysilicon elements 14a. This difference in thickness may be advantageously utilized to the end of having the oxide elements 18 serve as a self-aligned mask for selective ion implantation of a first dopant species into the silicon wafer 10.

Ions may be implanted selectively in the regions of the silicon wafer 10 underlying the polysilicon elements 14a by exposing the wafer to a beam of ions of appropriate impurity concentration and of sufficient energy to penetrate the polysilicon elements 14a and silicon oxide layer 12 without penetrating the thick silicon oxide elements 18. For a polysilicon layer of 5000 A thickness, boron may be used with an ion beam energy of 200 keV so as to produce p implanted regions 20 having a moderate concentration of $6 \times 10^{11}$ ions/cm$^2$ to produce a moderately doped p region in a lightly doped p- background. This beam will not penetrate the adjacent approximately 10,000 A layer of SiO$_2$ elements 18, bearing in mind the 200 keV boron ion would penetrate approximately 6500 A of Si or SiO$_2$.

Figure 6:
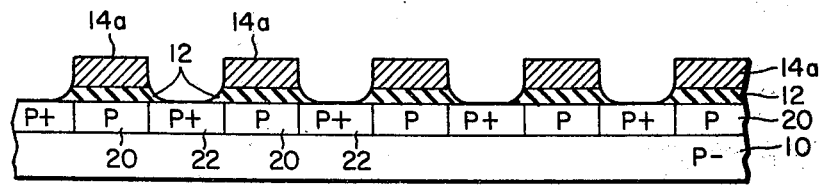

After the ion implanted regions 20 are produced, the silicon oxide elements 18 are removed by etching with buffered hydrofluoric acid. Oxide is removed right down to the surface of the silicon wafer 10, as shown in FIG. 6. Now the polysilicon elements 14a may serve as a self aligned mask for ion implantation of a second dopant species in the surface regions of the wafer 10 between the first implanted regions 20.

For the second dopant species a less energetic beam of boron ions is used that will not penetrate the polysilicon elements 14a and the underlying silicon oxide layer 12. In the example given above, a beam energy of less than 100 keV of boron would not penetrate the 5000 A polysilicon elements 14a and the silicon oxide layer 12 while allowing the regions 22 to be doped with a heavy concentration of $2 \times 10^{12}$ ions/cm$^2$. It will be seen at this stage that the alternate moderatly doped p regions 20 and heavily doped p+ regions 22 are self aligned with the polysilicon pattern of elements 14a lying above.

Figure 7:
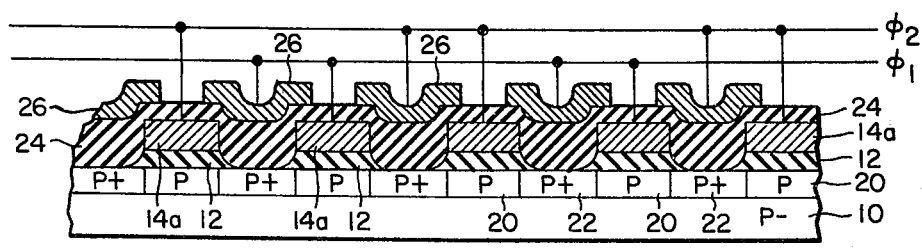

In the next stage of the processing shown in FIG. 7, a thermal oxide coating 24 is grown to cover the entire structure. Finally, a layer of metal, such as aluminum is deposited over the oxide coating 24 and patterned to form a second group of strip electrodes 26 interleaved with and preferably overlapping the first group of electrodes constituted by the polysilicon strip elements 14a.

It will be seen that the more lightly doped p regions 20 are registered with the lower gate electrodes or polysilicon elements 14a, and the more heavily doped p+ regions 22 are registered with the upper gate electrodes 26. A two phase charged coupled device is produced when alternate pairs of gate electrodes 14a and 26 are connected together to a common first voltage phase $\phi_1$ and the intermediate adjacent pairs of gate electrodes are coupled together to a common second voltage phae $\phi_2$.

Voltage levels of the two phases $\phi_1$ and $\phi_2$ may be adjusted to produce appropriate transfer-storage regions beneath the electrodes 14a and 26. With a p type wafer 10, the voltages are positive to produce an inversion in the semiconductor surface from the majority carriers or holes, to minority carriers, or electrons. Since the lower gate electrodes 14a are closer to the substrate surface than the upper gate electrodes 26, a lower positive threshold voltage is required to produce the necessary inversion, and for the same positive voltage above threshold, a deeper potential well exists under each lower gate electrode 14a than under each upper electrode 26. Moreover, this difference in threshold voltage and potential wells is further enhanced by the difference in the doping of the two implanted regions 20 and 22, with the more heavily doped regions 22 requiring a still higher threshold voltage than the more lightly doped regions 20 and also producing still shallower potential wells under the upper gate electrodes 26 than under the lower gate electrodes 14a.

It will of course be understood by those skilled in the art that instead of the p type CCD structure described above by way of illustration, an n type CCD structure may be fabricated according to the teachings of the invention by starting with a wafer of n type silicon and thereafter selectively implanting n type impurity ions therein, such as phosphorus, in a manner similar to that described above.

What is claimed is:

1. A method of forming a layer of electrically isolated elements of polysilicon separated by regions of silicon oxide, comprising:
  A. forming a continuous layer of polysilicon on an electrically insulating substrate surface; and
  B. selectively oxidizing spaced regions of said polysilicon layer through the entire depth thereof while inhibiting oxidation of the remaining regions of said layer so that said remaining regions form elements of polysilicon separated from each other by spaced regions of silicon oxide that are thicker than said polysilicon elements.

2. The invention according to claim 1, wherein step (B) is performed by
  1. depositing a masking layer of relatively non-oxidizable material on said polysilicon layer;
  2. selectively etching said masking layer to remove regions thereof corresponding to the regions to be oxidized in said polysilicon layer; and
  3. heating the remaining structure in an oxidizing atmosphere for a sufficient time to oxidize the exposed regions of said polysilicon layer through their entire depth.

3. The invention according to claim 2, wherein following step (3), further including the step of chemically etching said masking layer to remove it without disturbing said polysilicon elements and silicon oxide regions.

4. A method of selectively implanting impurity ions in a semiconductor, comprising:
  A. forming an insulating coating on a semiconductor substrate;
  B. forming a continuous layer of polysilicon on said coating;
  C. depositing a masking layer of relatively non-oxidizable material on said polysilicon layer;
  D. selectively etching said masking layer to expose predetermined regions of said polysilicon layer;
  E. selectively oxidizing said polysilicon layer through the entire depth of said exposed regions to form regions of silicon oxide separating elements of polysilicon, with said silicon oxide regions being thicker than said polysilicon elements;

F. removing said masking layer; and

G. exposing said layer of polysilicon elements and silicon oxide regions to a first beam of impurity ions of sufficient energy to penetrate through said polysilicon elements and into the regions of said semiconductor substrate aligned therewith without penetrating said thick silicon oxide regions.

5. The invention according to claim 4 wherein said masking layer is a material selected from the group consisting of silicon nitride alumina.

6. The invention according to claim 4, and following step (G), further including:

H. removing said silicon oxide regions and the underlying insulating coating to form void regions between said polysilicon elements; and I. exposing said layer of polysilicon elements and said void regions to a second beam of impurity ions differing from said first beam so that said ions pass through said void regions and into the regions of said substrate aligned therewith without penetrating said polysilicon elements.

7. The invention according to claim 6, wherein said masking layer is a material selected from the group consisting of silicon nitride and alumina.

8. The invention according to claim 6, wherein said substrate is made of silicon and said insulating coating is thermally produced silicon oxide.

9. The invention according to claim 8, wherein said substrate is $p$ type silicon and said ion beams contain boron of differing impurity concentrations.

10. A method of fabricating a charge coupled device, comprising:

A. forming an insulating coating on a semiconductor substrate of given impurity type;

B. forming a continuous layer of polysilicon on said coating;

C. depositing a masking layer of relatively non-oxidizable material on said polysilicon layer;

D. selectively etching said masking layer to expose predetermined strip-like regions of said polysilicon layer;

E. selectively oxidizing said polysilicon layer through the entire depth of said exposed regions to form strip-like regions of silicon oxide separating strip elements of polysilicon, with said silicon oxide regions being thicker than said polysilicon elements;

F. removing said masking layer;

G. exposing said layer of polysilicon elements and silicon oxide regions to a first beam of ions of said given impurity type and of sufficient energy to penetrate through said polysilicon elements and implant a moderate concentration of ions in the regions of said semiconductor substrate aligned therewith without penetrating said thick silicon oxide regions;

H. removing said silicon oxide regions and the underlying insulating coating to form void regions between said polysilicon elements;

I. exposing said layer of polysilicon elements and said void regions to a second beam of ions of said given impurity type differing from said first beam and of sufficient energy to pass through said void regions and implant a heavy concentration of ions in the regions of said substrate aligned therewith without penetrating said polysilicon elements;

J. growing a thermal oxide coating to cover the entire structure thus formed; and K. depositing and patterning a metal electrode structure over said thermal oxide coating that is interleaved with said polysilicon strip elements, said polysilicon strip elements serving as one group of electrodes and said metal electrode structure serving as the other group of electrodes of a two phase charge coupled device.

11. The invention according to claim 10, wherein said second ion beam is less energetic than said first beam.

12. The invention according to claim 10, wherein said masking layer is a material selected from the group consisting of silicon nitride and alumina.

* * * * *